United States Patent [19]
Corkhill et al.

[11] 3,947,806
[45] Mar. 30, 1976

[54] AUTOMATIC GAIN CONTROL FOR SEISMOMETER RECORDERS

[75] Inventors: David P. Corkhill, Hertfordshire, England; Francis R. Freeman, Tulsa, Okla.

[73] Assignee: Standard Oil Company, Chicago, Ill.

[22] Filed: Feb. 10, 1975

[21] Appl. No.: 548,722

[52] U.S. Cl. ........... 340/15.5 GC; 235/154; 330/86; 330/144; 330/124 R
[51] Int. Cl.². G01V 1/16; H03F 3/68; H03G 11/04
[58] Field of Search. 340/15.5 GC; 330/144, 124 R, 330/86; 235/154

[56] References Cited
UNITED STATES PATENTS

| | | | |
|---|---|---|---|
| 3,392,370 | 7/1968 | Neitzel | 340/15.5 GC |
| 3,436,723 | 4/1969 | Savit | 340/15.5 GC |
| 3,466,596 | 9/1969 | Siems et al. | 340/15.5 GC |
| 3,525,948 | 8/1970 | Sherer et al. | 340/15.5 GC |
| 3,699,325 | 10/1972 | Montgomery, Jr. et al. | 340/15.5 GC |
| 3,806,864 | 4/1974 | Broding et al. | 340/15.5 TS |
| 3,813,609 | 5/1974 | Wilkes et al. | 340/15.5 GC |

*Primary Examiner*—T. H. Tubbesing
*Assistant Examiner*—H. A. Birmiel
*Attorney, Agent, or Firm*—Newell Pottorf

[57] ABSTRACT

This is a seismic digital recording system for use where the seismic amplifiers are placed near the geophone locations and their outputs transmitted by common cable to the recording truck or recorded on magnetic tape at the geophone location. In such a digital recording system, it is impractical to use a high-speed, high gain-ranging amplifier of 15 or 16 bits range. In our design the gain-ranging amplifier is high-speed but employs fewer bits total range. The extra range is made up in a preamplifier which has a variable range of gain, which can be automatically set, but at slower speed. The invention involves a control system which is responsive to the output of an A/D converter which is connected to the output of the gain-ranging amplifier. This control examines the bit output of the A/D converter throughout the whole record and, depending on whether the most significant bit is a 0 or 1, and whether the less significant bits are 0 or 1, it acts to control the gain of the preamplifier on the suceeding record by increasing the gain, decreasing the gain, or leaving the gain set at its instant value. The gain of the preamplifier can be adjusted by 6-db steps for each succeeding record until it reaches a value for which the operation of the gain-ranging amplifier is optimum.

10 Claims, 3 Drawing Figures

AUTOMATIC GAIN CONTROL FOR SEISMOMETER RECORDERS

CROSS REFERENCES TO RELATED PATENT

This application is related to U.S. Pat. No. 3,806,864, issued Apr. 23, 1974, to Robert A. Broding and Francis R. Freeman.

BACKGROUND OF THE INVENTION

This invention lies in the field of seismic exploration systems. More particularly, it lies in the field of seismic recording systems, in which the recording amplifiers are positioned at the geophone locations and their outputs are either transmitted by common conductors to the recording trucks or recorded on a tape recorder at the geophone location.

In the prior art, seismic recording systems have traditionally involved setting out a plurality of geophone groups at spaced locations and connecting each of these geophone groups by separate conductor pairs to separate amplifier channels in a recording truck at some distance from the geophone locations. (See Milton Dobrin, "Introduction to Geophysical Prospecting". McGraw-Hill, 1952, pp. 201–208.) In the recording truck, a complex amplifier system was provided in which the gain could be ranged (automatically changed) over a wide range. Such a system is described in U.S. Pat. No. 3,315,223. This gain-changing was done in steps differing by a factor of $2^n$ (where $n$ is an integer) at a high rate of speed.

With the advent of recording systems requiring many more channels, up to 96 to 200 or more, it has become convenient to provide simpler amplifiers at each of the geophone locations or more usually to serve a small group of geophone locations. One such system is described by U.S. Pat. No. 3,806,864, in which two seismic recording channels are provided at the location of two adjacent geophone groups and the outputs of the amplifiers are locally recorded on magnetic tape cassettes. Because of the difficulty (in size, weight, and power drain) of having very complex high-speed, gain-ranging amplifiers, these newer amplifiers are of lesser total gain range. However, there are adjustable or present types of preamplifiers that can be set manually to provide adjustable gain in addition to the gain range set by the amplifier itself.

SUMMARY OF THE INVENTION

It is the primary object of this invention to provide a field seismic recording system of reduced range of high-speed gain-ranging amplifier with a preamplifier that has a selected range of gain which can be automatically adjusted at a lower speed than the rate of gain-ranging of the amplifier itself.

This and other objects are realized and the limitations of the prior art are overcome in this invention by providing a recording system having a preamplifier in which there are a selected number of steps of gain automatically adjustable at a slow rate, and a gain-ranging amplifier of lesser total gain range than the conventional field amplifier. The preamplifier leads into the gain-ranging amplifier and the output of the gain-ranging amplifier goes to an analog-to-digital converter, which then goes to a local recording means or by a transmission system to the multichannel recording truck.

The essence of this invention lies in a control system which automatically examines or scans the output of the analog-to-digital converter throughout the entire record and, dependent on whether the output of the various bits of the converter is a logical 0 or a logical 1, throughout the record; one or the other of two latches may be set. The combination of setting of one or both latches, controls an up/down counter to close or open certain switches. The preamplifier is of a design in which the gain can be changed by predetermined, fixed amounts. For example, the gain can be changed by connecting a feedback resistance of selected value from the output to the input. Preferably, four such switches are provided, which control the shunting of four different resistances, one at a time, from the output to the input of the preamplifier. Other equivalent systems of fixed gain change could be employed.

The output of the up/down counter has four output leads which are connected to the four switches in the preamplifier and, dependent on the set condition of the two latches, responsive to the analog-to-digital converter, the counter is raised, or lowered, or maintained the same, so far as count is concerned, and dependent on the count of the counter, one or another of the four switches in the preamplifier is closed.

The operation of the up/down counter is carried out only each record under the control of the end-of-record pulse. (Equipment to produce such a signal at the end of the record has been used for years in recorders, so no effort is made here to illustrate it.) Therefore, at the end of a record, the end-of-record pulse enables the counter to move up, or down, or stay the same, dependent on the condition of the two latches. If there is a change in count, then a different switch is closed in the preamplifier, adjusting the gain to a value which will make the operation of the gain-ranging amplifier more nearly optimum for the following and succeeding records.

BRIEF DESCRIPTION OF THE DRAWINGS

These and other objectives and advantages of this invention and a better understanding of the principles and details of the invention will be evident from the following description taken in conjunction with the appended drawings, in which.

DESCRIPTION OF THE PREFERRED EMBODIMENT

Figure 1:
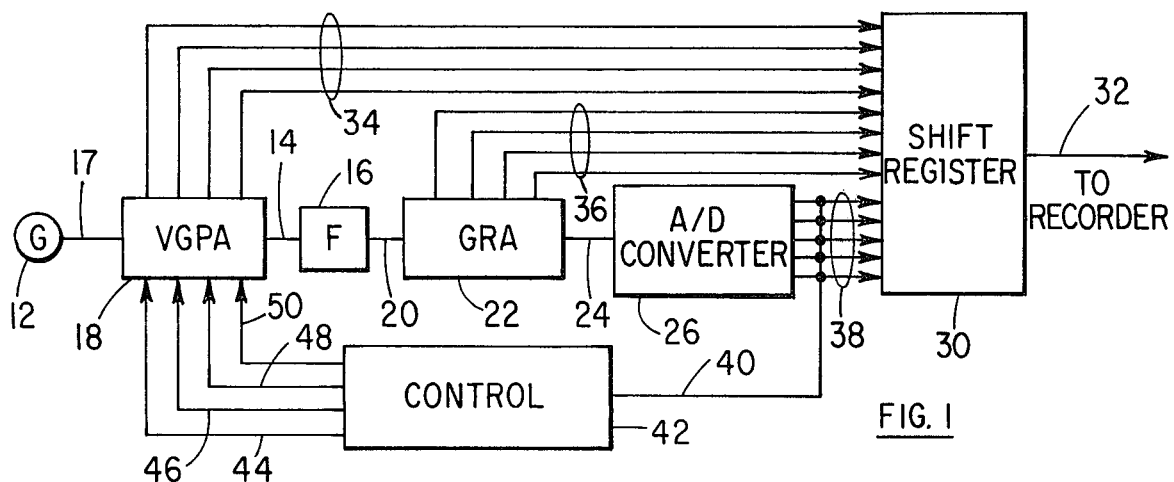
FIG. 1 represents a schematic diagram of the overall seismic recording system.

Referring now to the drawings and in particular to FIG. 1, there is shown a schematic diagram illustrating the essential parts of a single channel of seismic recording system. There are one or more geophones 12 connected to a variable gain preamplifier 18 (VGPA) which is connected by means 14 to a filter 16 and by means 20 to a gainranging amplifier 22 (GRA), which is connected by means 24 to an analog-to-digital converter 26 (A/DC). The output of the analog-to-digital converter comprises a plurality of leads 38, each of which represents a bit in the total number of bits in the digital word representative of the seismic signal level. These leads 38 are connected to a shift register 30 where they are stored until required to be sent to a local magnetic tape recorder or to a transmission line 32 to the recording truck, where they are recorded on magnetic tape.

The gain-ranging amplifier 22 also has a group of leads 36, which is connected to the shift register 30. The signals on these leads represent the number of steps of gain ranging, each of 6 db, through which the amplifier has ranged in gain, while the remaining amplitude of the signal output on lead 24 is converted in the analog-to-digital converter 26 to additional digital bits representative of the remainder signal amplitude. The combination of the digital signals on leads 36 and 38 represent the total number of bits of amplitude of the signal on lead 20 entering the gain-ranging amplifier 22.

The variable gain preamplifier 18 has a group of outputs indicated by leads 34, which also go to the shift register. The signals on leads 34 represent 6-db steps of gain change in the preamplifier, which, in addition to the gain steps indicated by leads 36 and the amplitudes indicated by the leads 38, represent the total absolute amplitude of the seismic signal on lead 17 entering the preamplifier 18.

The normal way of initially handling the gain settings in the preamplifier 18 is by manual control of switches or by remote manual control, which operate to change the gain of the preamplifier.

There is shown a box 42 which is a control system and which will be described in detail in connection with FIG. 2. This box 42 takes inputs from the leads 38 on the output of the A/D converter, which are grouped together as multiple lead 40 going into the box 42. For this illustration the inputs to box 42 are taken from the output of the A/D converter 26, however, the input to box 42 may also be taken from the appropriate leads 36 representing the gain of the gain ranging amplifier, keeping in mind that a low gain value is the equivalent of a large A/D converter output bit value. The outputs of the control box 42 are a plurality of up to four or more leads. These represent signal lines which are connected to appropriate connections in the variable gain preamplifier 18, as will be explained in greater detail in connection with FIG. 3. The signal on the leads 44, 46, 48, and 50 go to electronic switches which connect appropriate resistors between the output and the input of the variable gain preamplifier to change its gain in a preselected manner.

Figure 2:
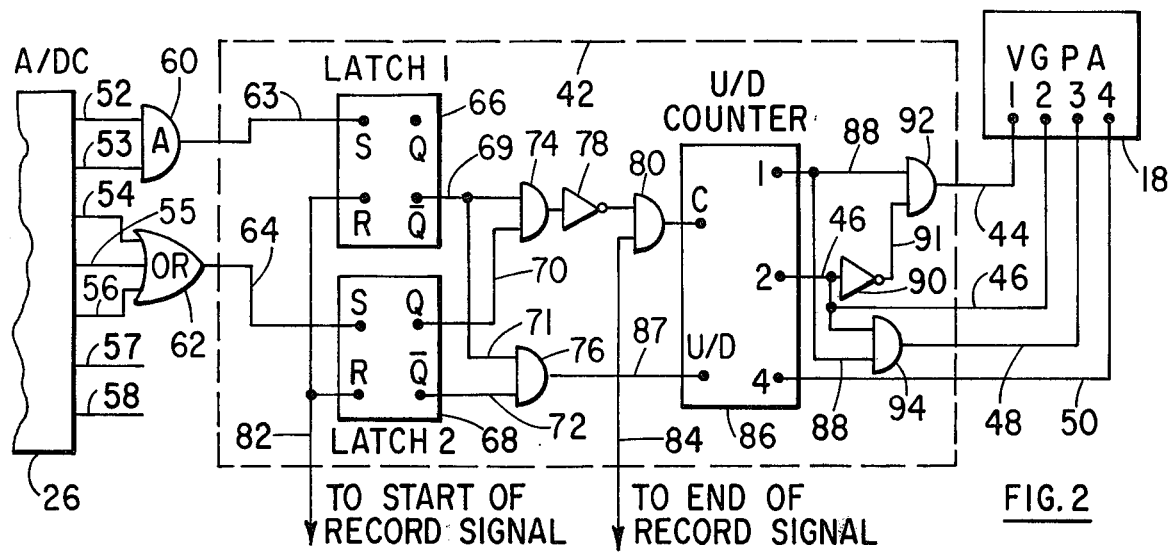
FIG. 2 shows in detail the construction of the control system for automatically adjusting the gain of the preamplifier.

Referring now to FIG. 2, there is shown on the left side a portion of the box 26 representing the analog-to-digital converter, and on the right a box 18 which represents the variable gain preamplifier. The dashed line 42 represents the boundary of the control box 42 of FIG. 1. The leads 52 to 58 on the output of the analog-to-digital converter 26 corresponds to the leads 38 of FIG. 1. Lead 52 represents the most significant bit, lead 53, the second most significant bit, 54, 55, 56, etc., intermediately significant bits, etc., preselected as desired to establish the signal level at which an increase in preamplifier gain is to occur. Leads 52 and 53 go to an AND gate 60, the output of which goes by lead 63 to the set terminal of a first latch 66. A latch is a device such as a flip-flop which has two operating positions. A slower-acting version would be a latching relay. A potential at the set terminal S sets the latch in a first position, and a corresponding voltage on a reset terminal R (on lead 82) resets the latch back to its original position. There are two terminals on the output, a Q and a $\overline{Q}$ terminal. When the latch is in its original position, that is, its reset position, the Q terminal has a logical 0, and the $\overline{Q}$ terminal has a logical 1. In the set condition, after the voltage on lead 63 to the S terminal sets latch 1, the Q terminal carries a logical 1, and the $\overline{Q}$ terminal a logical 0. Similarly, there is a second latch 68 with the set and reset terminals, and Q and $\overline{Q}$ terminals. This latch 2 is set by the output on lead 64 from the OR gate 62. There can be 1, 2, 3, or more, input connections to the OR gate 62. However, the configuration of leads 52, 53 to the AND gate 60, and 54, 55, and 56 to the OR gate 62 are based on a certain philosophy which will be explained later in the description. Suffice to say that during the recording of a record on the system of FIG. 1, if any one of the leads 52, 53, 54, 56 has a logical 1, then the corresponding latch 66 or 68, or both, will be set. If none of the leads 52 to 56 has a logical 1 during the record, then neither of the latches will be set.

The presence of a logical 1 on the leads 52 and 53, which represent the most significant bits, indicates that the signal level had been very high, and probably too high, and therefore the gain of the amplifier should be reduced. If none of the leads 52-56 carries a logical 1 throughout the record, it means that the amplitude of the signal coming to the gain-ranging amplifier had been too low, and therefore the gain of the preamplifier should be raised. The design of the control box 42 is such that when the appropriate signals, such as a logical 1 or a logical 0, are on the leads 52 to 56, appropriate signals are sent from the latches 66, 68 through the Q and $\overline{Q}$ terminals, and through additional logic, to an up/down counter means 86. This is an electronic device in which a pulse on the C (clock) terminal, and a corresponding signal on lead 87 to the U/D terminal will cause the counter to go up one step or down one step. If the counter is to retain its present count, the logic prevents the pulse on the C terminal. The decision to change the gain up or down is made only when there is a logical 1 on the clock terminal C. The voltage on this terminal is provided from an AND gate 80, which has two inputs. One input on lead 84 comes from a detector that recognizes a pulse representing the end of the record. In other words, only when a complete record has been recorded, a pulse is put on the tape, and that end-of-record pulse then goes to the gate 80, and, if the gate is enabled by the signal from the gate 74 through inverter 78, then the pulse will go to the clock terminal C, and then, depending on the signal on the line 87, the counter will adjust its count.

The latches 1 and 2 are responsive to the logical 1 or 0 on each of the output leads on the A/D converter 26. Assume that the signal is a large one and is probably too large for the gain-ranging amplifier. In this case, all of the leads 52, 53-56, will have a logical 1 at some time during the recording of the record. Thus, there will be at some time a logical 1 on leads 52 and 53, which will enable the AND gate 60 and put a logical 1 on the lead 63 and will set the latch 66. When latch 66 is set, the $\overline{Q}$ terminal carries a logical 0. Assuming also that at least one of the leads 54, 55, 56 carries a logical 1 at some time during the record, then a logical 1 will be present on the lead 64, and that will set the latch 68, and will put a logical 0 on the $\overline{Q}$ terminal.

Consider the AND gate 76, having two input leads, 71 and 72 going, respectively, to the $\overline{Q}$ terminals of latches 66 and 68. If these are logical 0 ', then the output will be a logical 0 on lead 87. Also, if the Q signal of latch 66 is logical 0 and the Q signal of latch 68 is a logical 1, then the two leads 69 and 70 going to gate 74 will produce a logical 0 output of the gate and the inverter 78 will cause a logical 1 to be present on its output going to gate 80. Consequently, the logical 1 from the inverter 78 and the logical 1 from the end-of-record signal will enable the gate 80 and put a logical 1 on the clock terminal C and, since the voltage on the up/down terminal is a 0, it will cause the counter to count down by 1 count.

Consider now the case where all of the leads 52 to 56 carry a logical 0. In that case, the latch 66 will not be set and the latch 68 will not be set, so that the $\overline{Q}$ outputs will each carry a logical 1. The AND gate 74 carries a logical 1 on terminal 69 and a logical 0 on terminal 70 and therefore has a logical 0 output, which is converted to a logical 1 by the inverter 78, and so the gate 80 is enabled and the end-of-record signal will put a logical 1 on the clock terminal C. At the same time, there are logical 1 signals on lead 71 and 72, making a logical 1 on lead 87. Then, when the clock pulse comes in, the U/D counter will count up one step.

For a condition where the leads 52 and 53 do not have a logical 1, whereas one or the other of leads 54, 55, or 56 does have a logical 1, then latch 66 will not be set, but latch 68 will be set. When that happens, the $\overline{Q}$ terminal of latch 66 carries a logical 1, and the Q terminal of latch 68 carries a logical 1, so the gate 74 passes a logical 1 and the inverter makes that a logical 0, so the gate 80 is not enabled, and therefore the end-of-record pulse coming in on line 84 does not reach the clock terminal of the counter, and so no change is made in the count of the counter.

Thus, it can be seen that by appropriate recognition of the presence of a logical 1 or 0 at some time during the recording of a complete record, one or the other, or neither, or both of the latches 66 and 68 can be set, and therefore the appropriate action of the up/down counter will be carried out. The U/D counter is a commercial device, which can be purchased off the shelf. It is manufactured by a number of companies, such as the Radio Corporation of America, for example. The particular counter which has been used (an RCA COS/MOS presettable Up/Down Counter CD 4029A) has four counts and is provided with three terminals numbered 1, 2, and 4, which represent the appropriate bits. There are four lines out of the control 42, namely 44, 46, 48, and 50, which go to the preamplifier 18. These four connections are derived from the three terminals 1, 2, and 4 of the U/D counter 86 by means of the logic units shown. For example, there is an AND gate 92. One input 88 is connected to terminal 1, representing the count of the first bit. A second lead 91 is connected through an inverter 90 to the terminal 2, representing the count of 2. With a 1 on the first terminal and a 0 on the second terminal, the gate 92 is enabled, and a logical 1 goes on line 44 to terminal 1 of the preamplifier 18, which closes electronic switch 1 for a certain gain setting of the preamplifier.

For a count of 2, the terminal 2 carries a logical 1, and is connected directly, by lead 46, to terminal 2 of the preamplifier. For a count of 3, an AND gate 94 is used which has one lead going to each of the terminals 1 and 2. In other words, a logical 1 on each of the terminals 1 and 2, will cause the gate 94 to carry a logical 1 on the output line 48, going to switch 3 of the preamplifier. Line 50 goes directly from the terminal 4 of the counter to the terminal 4 of the preamplifier, and to the switch 4.

Figure 3:
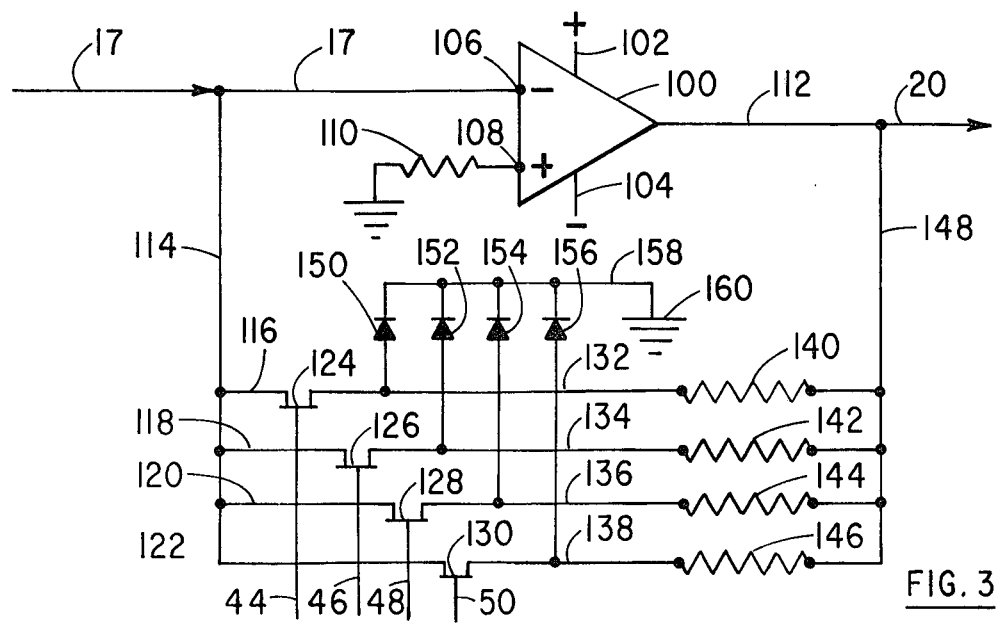
FIG. 3 illustrates the way in which the gain control of the preamplifier is automatically carried out.

Referring now to FIG. 3, there is shown in schematic form an amplifier 100, which has an input to terminal 106. This is supplied with appropriate power by leads 102 and 104. This is served by a line 17 which, as shown in FIG. 1, is the input to the variable gain preamplifier 18. The other input terminal 108 is gounded through resistance 110. The output of the amplifier 100 is on lead 112, which is marked by the arrow 20, which in FIG. 1 shows the outgoing lead to the gain-ranging amplifier. Therefore, amplifier 100 of FIG. 3 corresponds to VGPA 18. Line 114 is connected to the input of the amplifier 100, and line 148 to the output of the amplifier. There are four resistors, 140, 142, 144, 146 connected between these two lines 114 and 148, through electronic switches 124, 126, 128, and 130, lines 116, 118, 120, and 122, lines 132, 134, 136, and 138, and resistors 140, 142, 144, and 146. These are conventional devices, such that when a positive voltage is placed on the base or actuating contact, that is, on lead 44, 46, 48, or 50, the appropriate switch 124, 126, 128, or 130 will close, thus individually changing a feedback resistance to change the preamplifier gain a predetermined amount. In the figure shown, the switches thus are connecting the appropriate resistor in shunt between the output line 148 of the amplifier and the input line 114. EAch of the leads 132, 134, 136, and 138 from the switches to the resistors is connected through a diode, such as 150, 152, 154, 156, and line 158 to ground 160. This type of control is quite conventional and the leads 44, 46, 48, and 50, going to the variable gain preamplifier 18 in FIG. 1 would correspond to the leads 44, 46, 48, and 50 of FIG. 3. Appropriate voltage on one or the other of these four leads causes throw of the appropriate switch, and sets the gain of the preamplifier to a selected value.

FIG. 1 has been patterned after FIG. 4 of the U.S. Pat. No. 3,806,864, of Broding and Freeman.

While the field of application of this seismic recording system has been indicated as primarily for use with a seismic system in which the recorder is placed at the seismometer location and its output is recorded on magnetic tape at that point, there are many other fields of application of this type of amplifier. It can be used with any type of seismic recording system in which it is decided that a gain-ranging amplifier of less total gain range than conventional amplifiers is desired. In such case, a plurality of stages of gain can be placed in the variable gain preamplifier, as indicated in the description in connection with FIGS. 1, 2, and 3.

While there has been shown a system in which there are four stages of gain, of 6 db each, in the preamplifier, which stages are operated automatically at a low rate of speed, namely, one step for each record recorded, there can be fewer or more steps of gain (or of different db amounts), as desired, by providing additional counts in the counter and appropriate logic according to that which has already been described.

In FIG. 1 it has been shown that all digital signals on leads 34, 36, 38, go to a shift register 30. Such shift register is only symbolic of many combinations of digital storage and transmission elements which might be used. The digital signals on leads 36, 38 are redetermined at each digitizing interval, and therefore rapid signal handling, storage, and transmission means, such as shift register 30, are required. Conversely, the signal on leads 34 are reevaluated once for each record that is recorded, and need be recorded on the tape only once per record, instead of once per digitizing interval. Therefore, the digital signals on leads 34 can be handled in many other ways to be recorded on tape, in addition to the manner indicated through the shift register 30.

What has been described is a recording system in which the gain-ranging activity is divided between a very rapidly acting part in the floating-point, gain-ranging amplifier, and a slower-acting part in a preamplifier. Since it is not necessary to range through the full gain of the system each digitizing interval, part of that gain-ranging can, in effect, be automatically preset for a succeeding record, based on the gain required in the preceding records. These extra stages of gain-ranging can be provided in the preamplifier at a fraction of the cost in money, power, and space required for a comparable range of gain in the gain-ranging amplifier. The prior art has utilized manual gain settings in the preamplifier. It is therefore obvious that the automatic setting of gain in the preamplifier, based on the gain requirement of the previous record, is more advantageous than the manual setting, or the incorporation of an equivalent gain range in the gain-ranging amplifier.

While the invention has been described with a certain degree of particularity, it is manifest that many changes may be made in the details of construction and the arrangement of components. It is understood that the invention is not to be limited to the specific language used, or the specific embodiments set forth herein by way of exemplifying the invention, but the invention is to be limited only by the scope of the attached claim or claims, including the full range of equivalency to which each element or step thereof is entitled.

We claim:

1. In a digital seismic recording system having at least one recording channel responsive to a first geophone group and including therein a preamplifier, a gain-ranging amplifier, and an analog-to-digital converter, all connected in series, said preamplifier including switching means to vary the gain of said preamplifier in a plurality of steps, said gain-ranging amplifier including means to vary the gain in steps at a relatively high rate, over a selected plurality of steps, said analog-to-digital converter adapted to produce a digital word representing the instantaneous amplitude of the signal output of said gain-ranging amplifier at each digitizing interval, said digital word comprising at least
   1. a most significant bit,
   2. a second most significant bit, and
   3. an intermediately significant bit, the improvement comprising:
      a. a first latch and means responsive to said digital word output of said analog-to-digital converter to set said first latch when said most significant bit is a logical 1 at any time during the time of recording of a complete record;
      b. a second latch and means responsive to said digital word output of said analog-to-digital converter to set said second latch when at least one intermediately significant bit is a logical 1 at any time during the time of recording of a complete record; and
      c. means responsive respectively to said first and to said second latches to modify the gain of said preamplifier.

2. The seismic recording system as in claim 1 including means to increase the gain of said preamplifier one step when neither said first nor said second latches is set during recording of a complete record, to decrease said gain one step when both said first and said second latches are set during such recording, said means being inoperative to change said gain when said first latch is not set and said second latch is set during such recording.

3. The seismic recording system as in claim 2 in which said means to modify the gain of said preamplifier comprises:
   a plurality of electronic switch means each separately operable to change a resistance in said preamplifier whereby the preamplifier gain is changed a predetermined amount, and an up/down counter means responsive to said first and said second latches and acting through a plurality of outputs to control said plurality of said electronic switch means.

4. The seismic recording system as in claim 3 in which said up/down counter means has a clock input and an up/down input including
   an AND gate the two inputs to which are the $\overline{Q}$ output of said first latch and the Q output of said second latch,
   an inverter connected to the output of said AND gate,
   a second AND gate, the two inputs to which are the Q output of said first latch and the $\overline{Q}$ output of said second latch, the output to said second AND gate being connected to said U/D input of said counter,
   means to produce an end-of-record electric signal at the end of said complete record, and
   a third AND gate the two inputs to which are the end-of-record signal and the output of said inverter, the output of said third AND gate being connected to said clock terminal of said counter.

5. The seismic recording system as in claim 4 in which said up/down counter means has at least 3 output terminals representing in binary code the number of the count, including:
   a. a second inverter, the input of which ic connected to the terminal of said counter representing the count of 2,
   b. a fourth AND gate, the two inputs to which are connected to the output of said second inverter and to the terminal of said counter representing the count of 1, and the output of which is connected to actuate the first of said electronic switch means,
   c. the terminal of said counter representing the count of 2 additionally being connected to actuate the second of said electronic switch means,
   d. a fifth AND gate, the two inputs to which are connected respectively to the count of 1 and the count of 2 terminals of said counter and the output of which is connected to actuate the third of said electronic switch means, and
   e. the terminal of said counter representing the count of 4 being connected to actuate the fourth of said electronic switch means.

6. The seismic recording system as in claim 1 including means responsive to a start-of-record signal to reset said first and said second latches.

7. The seismic recording system as in claim 1 including an AND gate, the output of which goes to the set terminal of said first latch, the two inputs of said AND gate being connected, respectively, to the most, and the second most significant bit terminals of said analog-to-digital converter.

8. The seismic recording system as in claim 7 including an OR gate with its output connected to the set terminal of said second latch, the input terminals of said OR gate being connected, respectively, to said third and said fourth most significant bit terminals of said analog-to-digital converter.

9. The seismic recording system as in claim 8 including a third input lead to said OR gate connected to the fifth most significant bit terminal of said analog-to-digital converter.

10. The seismic recording system as in claim 1 including:
 a. a second recording channel responsive to a second group of geophones near in position on the earth to said first geophone group, and
 b. means to connect the switching means in the preamplifier of said second channel in parallel with the switching means of the preamplifier in said at least one channel.

* * * * *